United States Patent [19]

Matsuda et al.

[11] Patent Number: 5,094,879
[45] Date of Patent: Mar. 10, 1992

[54] METHOD OF ACTIVATING AT LEAST ONE GAS TO PRODUCE DIFFERENT CHARGED SPECIES, SELECTING SPECIFIC SPECIES, DECELERATING THE SPECIES, AND CHEMICALLY REACTING THE SPECIES TO FORM A THIN FILM

[75] Inventors: Tetsuo Matsuda, Kawasaki; Haruo Okano, Tokyo; Tokuhisa Ohiwa, Yokohama, all of Japan

[73] Assignee: Kabushiki Kaisha Toshiba, Kawasaki, Japan

[21] Appl. No.: 544,595

[22] Filed: Jun. 27, 1990

[30] Foreign Application Priority Data

Jun. 29, 1989 [JP] Japan .................................. 1-168153

[51] Int. Cl.⁵ .............................................. B05D 3/06
[52] U.S. Cl. .......................................... 427/38; 427/42; 427/47; 427/53.1; 427/255.2; 427/255.5
[58] Field of Search ............ 427/38, 47, 255.2, 255.5, 427/53.1, 42

[56] References Cited

U.S. PATENT DOCUMENTS 4,657,774  4/1987  Satou et al. ..................... 427/38

FOREIGN PATENT DOCUMENTS 3124987  6/1984  Fed. Rep. of Germany.
88/06194  8/1988  World Int. Prop. O.

*Primary Examiner*—Shrive Beck
*Assistant Examiner*—Benjamin L. Utech
*Attorney, Agent, or Firm*—Oblon, Spivak, McClelland, Maier & Neustadt

[57] ABSTRACT

According to a thin film forming method, at least one type of gas is activated to produce a plurality of species having positive or negative charges. The plurality of species pass through an electric field or magnetic field to extract specific species. The specific species are supplied to a substrate surface. Thereafter, the specific species are chemically reacted with each other to form a thin film. This extraction is performed using a difference in track corresponding to a ratio of mass to charge of the species passing through the electric field.

13 Claims, 7 Drawing Sheets

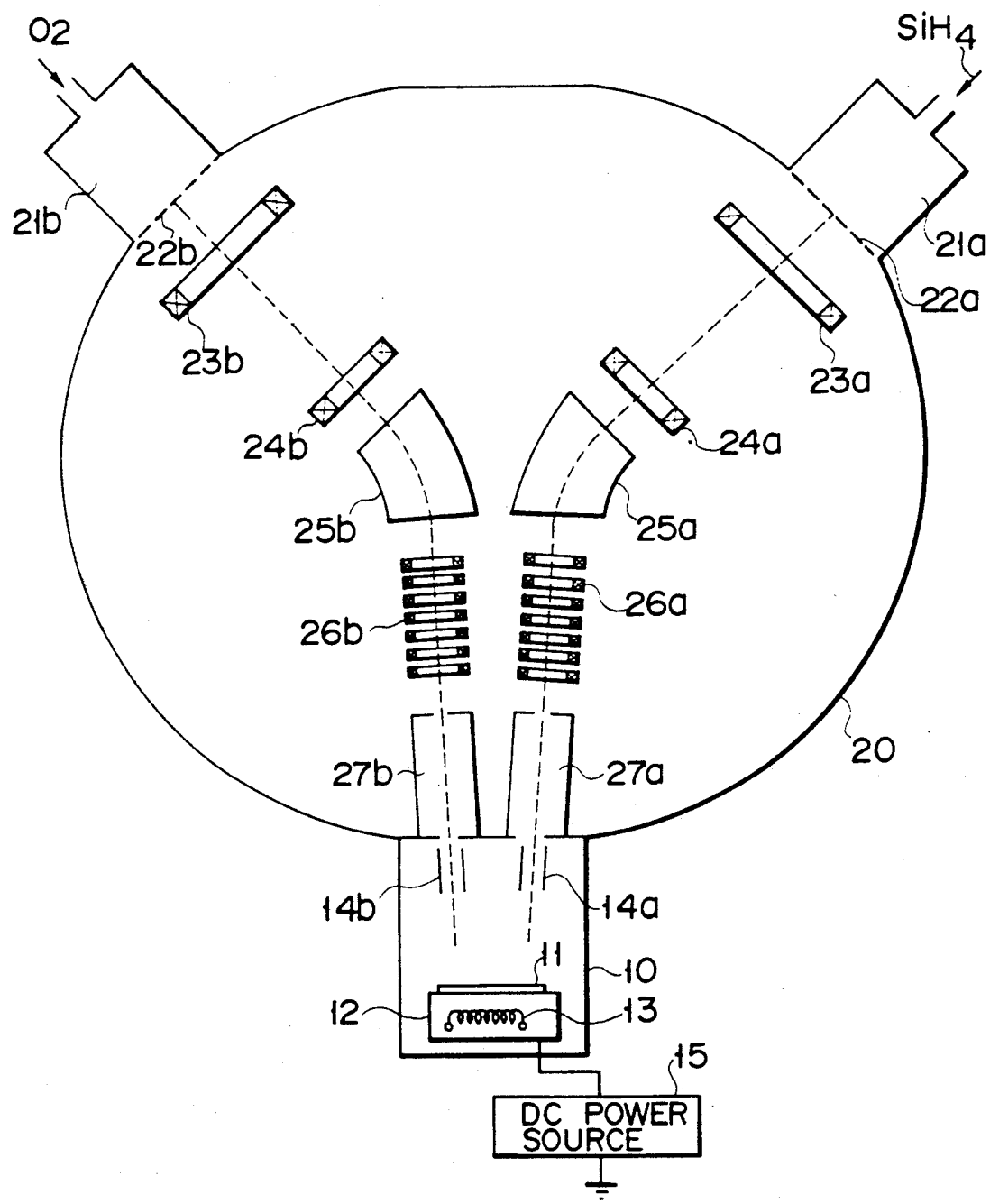
F I G. 1A

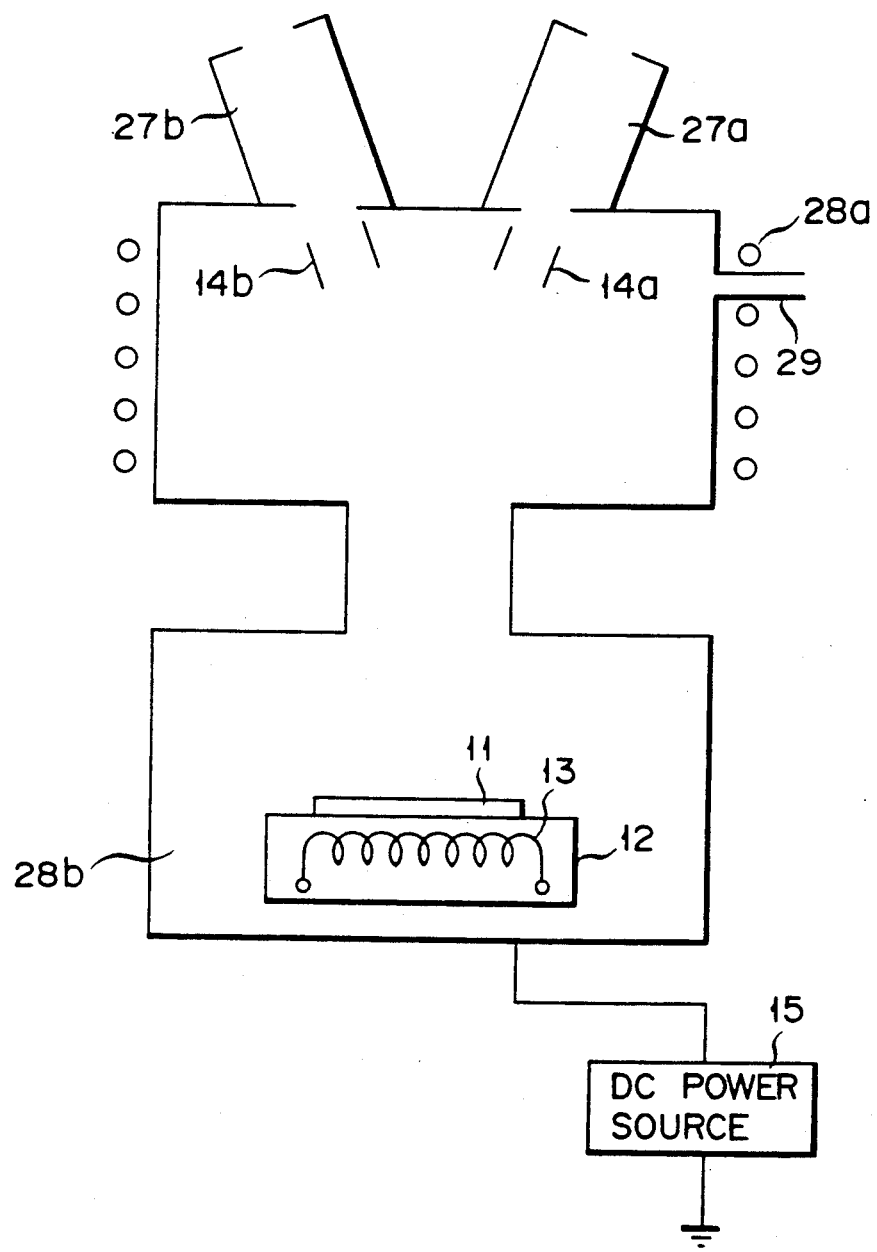
F I G. 1B

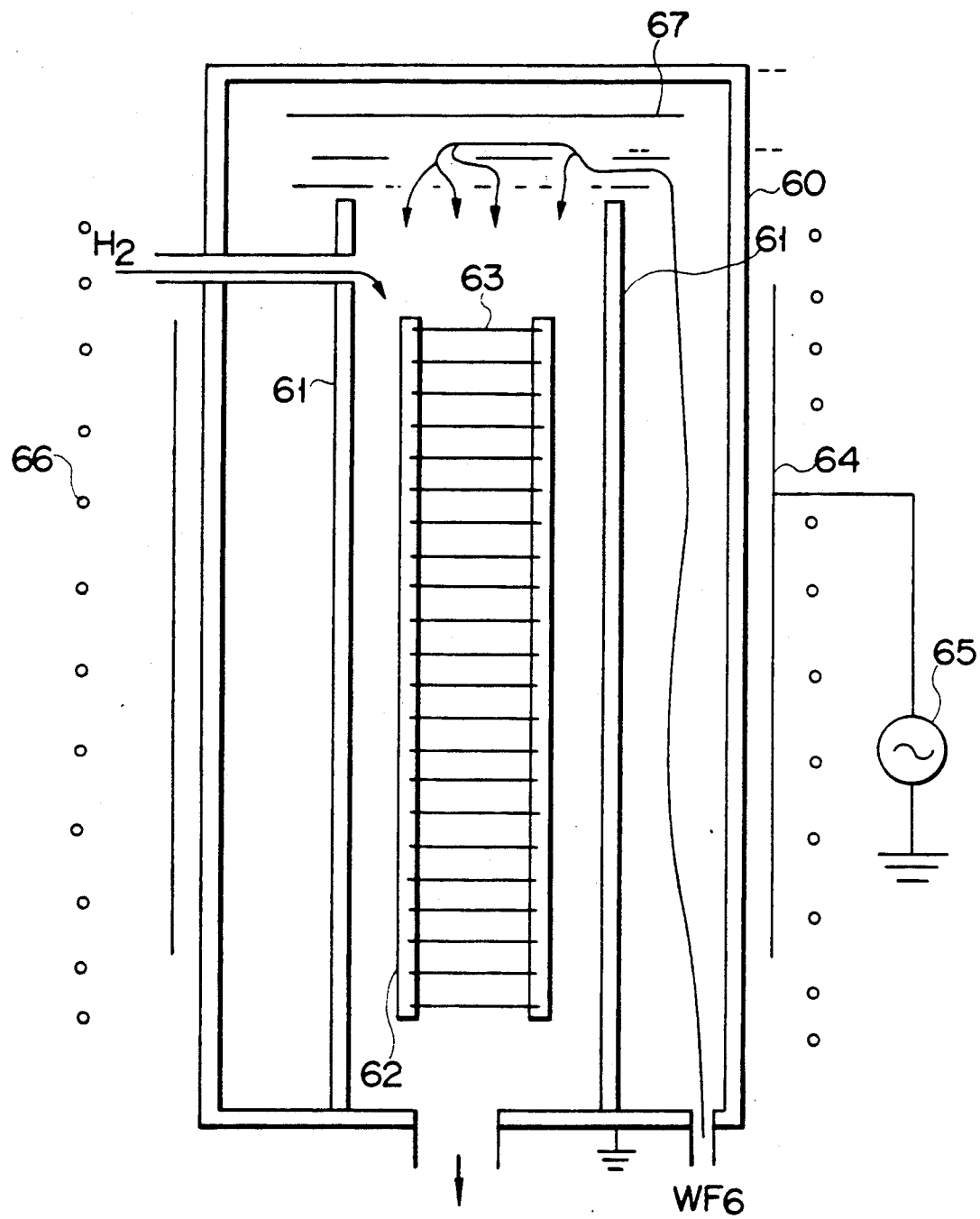
F I G. 5

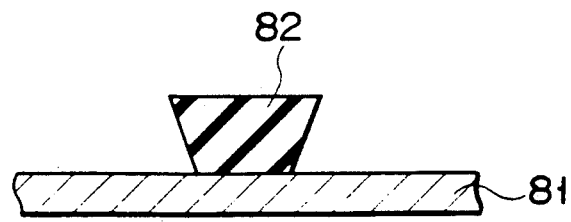
F I G. 8A
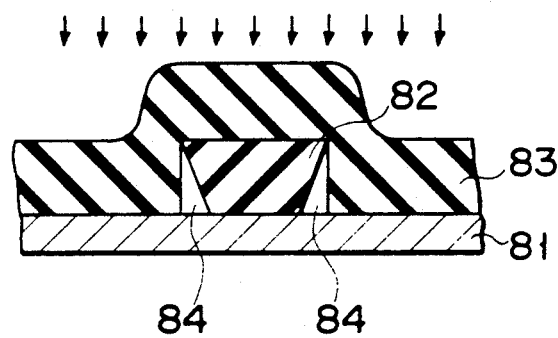
F I G. 8B
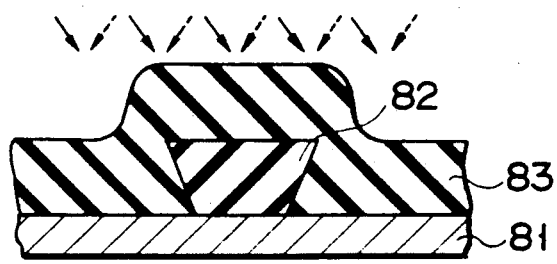
F I G. 8C

METHOD OF ACTIVATING AT LEAST ONE GAS TO PRODUCE DIFFERENT CHARGED SPECIES, SELECTING SPECIFIC SPECIES, DECELERATING THE SPECIES, AND CHEMICALLY REACTING THE SPECIES TO FORM A THIN FILM

BACKGROUND OF THE INVENTION

1. Field of the Invention

The present invention relates to thin film forming techniques employed in the manufacture of a semiconductor device such as a VLSI. More particularly, the present invention relates to a thin film forming method and apparatus using chemical vapor deposition (CVD).

2. Description of the Related Art

In recent years, CVD is widely used in the process of manufacturing a semiconductor device. This CVD includes the following steps. A predetermined gas is fed to a reaction furnace in which a substrate is placed to chemically react the gas on the substrate surface, thereby depositing a thin film on the substrate. In plasma CVD and photo assisted CVD among the CVD methods, since activation efficiency of a gas is increased by a plasma or a beam, a thin film can be deposited at a high rate even at a low temperature. For this reason, the plasma CVD and the photo-assisted CVD are effective in the manufacture of a semiconductor device. Therefore, the plasma CVD and the photo-assisted CVD are expected to be important in accordance with a decrease in temperature in the process of manufacturing a semiconductor device.

However, the these CVD methods have the following problems. That is, in plasma or photo-assisted CVD, a high-frequency wave or a beam is irradiated on a gas. For this reason, atoms consisting of the gas are excited. A primary decomposition reaction of the gas occurs until the gas reaches the substrate. As a result, many types of intermediates produced by the primary decomposition reaction are mixed in a deposition film. Some of the intermediates cause degradation of the density, chemical resistance, and hardness of the thin film formed on the substrate. Therefore, performance and reliability of the semiconductor device are degraded.

In the normal CVD, the primary decomposition reaction may be performed by heat. Therefore, these problems are applied to not only the plasma and photoassisted CVD methods but all other CVD methods.

SUMMARY OF THE INVENTION

It is an object of the present invention to provide a thin film forming method wherein intermediates produced by a primary decomposition reaction of a gas are prevented to be mixed into a deposition film, and the quality of the resultant thin film can be improved.

It is another object of the present invention to provide a thin film forming apparatus wherein intermediates produced by a primary decomposition reaction of a gas are prevented to be mixed into a deposition film, and the quality of the resultant thin film can be improved.

According to the present invention, there is provided a thin film forming method comprising the steps of activating at least one type of gas to produce a plurality of species having positive or negative charges, causing the plurality of species to pass through an electric field or magnetic field to extract specific species, and causing the selected species to react with each other on a substrate surface to form a thin film on the substrate.

According to the present invention, there is provided a thin film forming apparatus comprising: a reaction furnace accommodating a substrate therein; and species selecting/supplying means connected to the reaction furnace and including producing means for producing a plurality of species having positive or negative charges by activating a feed gas, and selecting means, positioned on the downstream of the producing means, for selecting specific species from the plurality of species.

According to the present invention, there is provided a thin film forming method comprising the steps of activating a predetermined gas to produce a plurality of species, performing selection of specific species by heating or cooling the plurality of species, and causing the selected species to chemically react with each other on the surface of a substrate to form a thin film on the substrate.

According to the present invention, there is provided a thin film forming apparatus comprising: a reaction furnace accommodating a substrate; and species supplying means connected to the reaction furnace and including producing means for producing a plurality of species by activating a feed gas, and selecting means, positioned on the downstream of the producing means, for selecting specific species by heating or cooling the plurality of species.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1A is a schematic view showing a thin film forming apparatus according to the first embodiment of the present invention;

FIG. 1B is a partly enlarged schematic view showing another thin film forming apparatus according to the first embodiment of the present invention.

FIG. 5 is a schematic view showing a thin film forming apparatus according to the sixth embodiment of the present invention;

FIGS. 8A, 8B, and 8C are sectional views showing a case wherein a thin film is formed on an overhang portion.

DESCRIPTION OF THE PREFERRED EMBODIMENTS

Figure 2:
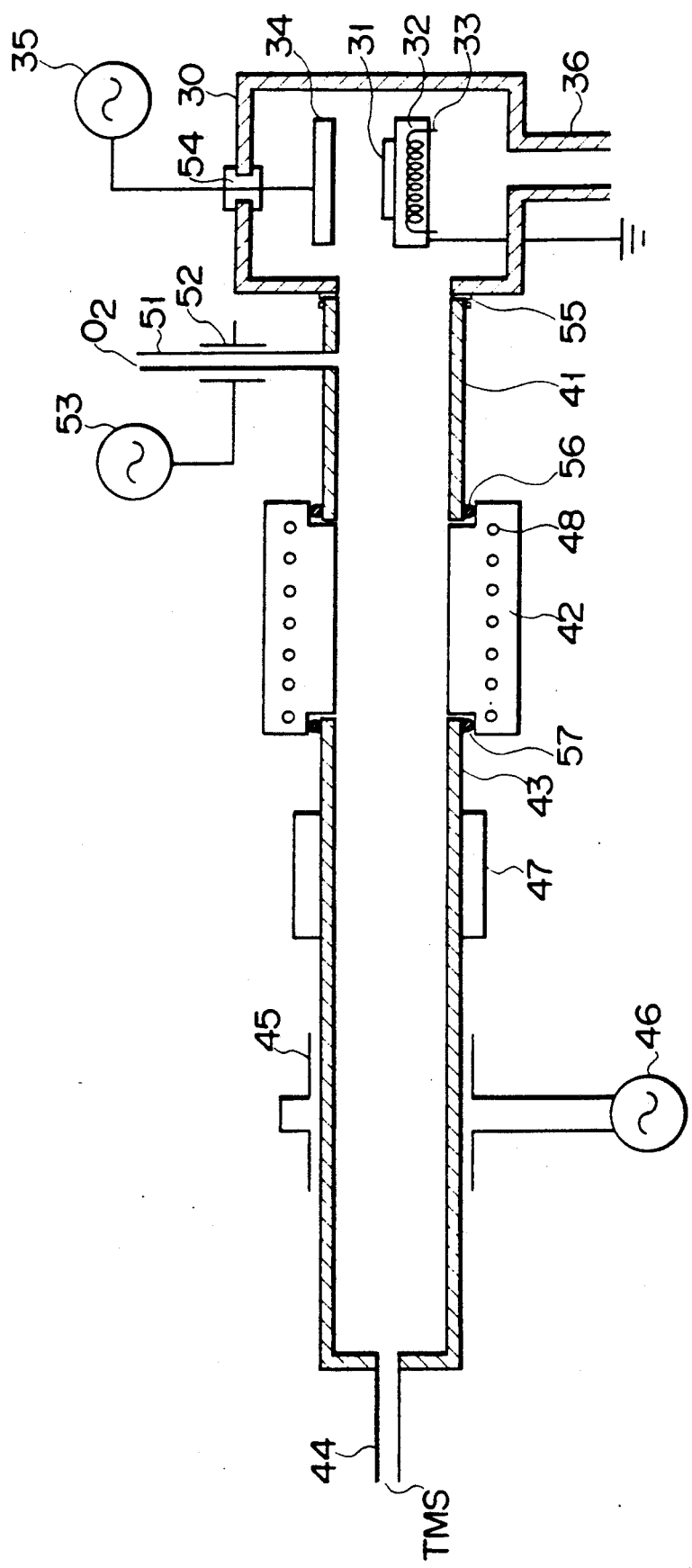
FIG. 2 is a schematic view showing a thin film forming apparatus according to the third embodiment of the present invention.

Embodiments of the present invention will be described below.

FIG. 1A is a schematic view showing a thin film forming apparatus according to the first embodiment of the present invention. The apparatus is constituted by a reaction furnace 10 for performing a film deposition reaction using CVD method and a gas selecting/supplying chamber 20 for selecting specific species and supplying them to the reaction furnace 10.

In the reaction furnace 10, a sample table 12 on which a substrate 11 is placed is housed. A heater 13 for heating the substrate 11 is arranged in the sample table 12. The sample table 12 is heated by the heater 13 and cooled by a coolant gas. Note that the reaction furnace 10 is evacuated by an evacuating means such as a vacuum pump (not shown). Deflectors 14a and 14b are arranged above the substrate 11. The deflectors 14a and 14b are used for supplying only neutral gases to the substrate 11 from species supplied from the species supplying chamber 20. A DC power source 15 for applying an DC voltage to the substrate 11 is connected to the sample table 12.

Two species supply paths are formed in the species selecting/supplying chamber 20. Each of the species supply paths is used for exciting species in a gas to extract predetermined specie and to supply them to the reaction furnace 10. A first species supply path is constituted by an ion source 21a, an ion-drawing electrode 22a, convergence lenses 23a and 24a, a mass filter 25a, a decelerator 26a, and a neutralizing chamber 27a. The ion source 21a is arranged in contact with the outer wall surface of the chamber 20. The ion-drawing electrode 22a for drawing ions is arranged for the ion source 21a. The convergence lenses 23a and 24a for converging the selected ions are sequentially arranged in the downstream of the ion source 21a. The mass filter 25a is arranged in the downstream of the convergence lenses 23a and 24a. The mass filter 25a extracts ions using a difference in track corresponding to a ratio of mass to charge of ions passing through an electric field. Instead of using electric field, magnetic field may be used for the mass fillter 25a. The decelerator 26a for decelerating the selected ions is arranged in the downstream of the mass filter 25a. In addition, the neutralizing chamber 27a for neutralizing the decelerated ions is arranged in the downstream of the decelerator 26a. The predetermined species are supplied from the neutralizing chamber 27a to the reaction furnace 10. As in the first species supplying path, a second species supplying path is constituted by an ion source 21b, an ion-drawing electrode 22b, convergence lenses 23b and 24b, a mass filter 25b, a decelerator 26b, and a neutralizing chamber 27b. Note that the chamber 20 is evacuated to a pressure of about $10^{-6}$ Torr by a vacuum pump (not shown).

A thin film forming method using the above apparatus will be described below. Here, a case wherein a silicon oxide film ($SiO_2$) is formed will be described.

A monosilane ($SiH_4$) gas is fed to the ion source 21a, and an oxygen ($O_2$) gas is fed to the ion source 21b. Microwaves each having frequency of 2.45 GHz are respectively applied from a high-frequency power source (not shown) to the ion sources 21a and 21b at an output of 800 W, thereby ionizing the gases. For example, the monosilane gas is ionized into $SiH^+$, $SiH_2^+$, $SiH_3^+$, $SiH^{2+}$, $SiH_2^{2+}$, $SiH_3^{2+}$, and the like, and the $O_2$ gas is ionized into $O^+$, $O^{2-}$, $O_2^+$, $O_2^{2+}$, and the like. At this time, a voltage of $-100$ V is applied to the ion-drawing electrodes 22a and 22b to draw each type of ions. Thus, each type of ions accelerated at 100 to several hundreds of eV are converged by the convergence lenses 23a and 24a or 23b and 24b to form an ion beam having a diameter of 15 mm. The ion beams are radiated through electric fields of the mass filters 25a and 25b. Since each type of ions has a predetermined ratio of mass to charge, each type of ions is traced along the corresponding track. Therefore, an electric field strength is properly selected to extract arbitrary types of ions and to supply them to the decelerators 26a and 26b.

In the first embodiment, $SiH_3^+$ and $O^+$ ions are supplied to the decelerators 26a and 26b. Both types of ions are decelerated to 3 eV by the decelerators 26a and 26b. These ions are electrically neutralized by the neutralizing chambers 27a and 27b and then supplied to the reaction furnace 10. Reaction furnace 10 contains neutral gas, which is irradiated with an ion beam to be neutralized. Non-neutralized ions are deflected by an electric field in the deflector 14 in the reaction furnace 10 and are traced along a track which does not reach the substrate 11. Thus, only the species of $SiH_3$ and O reach the substrate 11. At this time, the substrate 11 is heated to a temperature of about 420° C. by the heater 13.

$SiH_3$ is chemically reacted with O on the surface of the substrate 11 to form an $SiO_2$ film. The obtained $SiO_2$ film is etched by a hydrogen fluoride buffer solution ($NH_4F$ of 30%, HF of 6%) at a rate of 950 Å/min. This etching rate is lower than an etching rate of 7000 Å/min of an $SiH_4/O_2$-based $SiO_2$ film which is formed by a conventional LPCVD. That is, the obtained $SiO_2$ film has acid resistance which is equal to a thermal oxide film.

The second embodiment of the present invention will be described below. A case wherein an $SiO_2$ film is formed using the thin film forming apparatus in FIG. 1 will also be described.

A monosilane ($SiH_4$) gas is fed to an ion source 21a, and an oxygen ($O_2$) gas is fed to an ion source 21b. Microwaves each having frequency of 2.45 GHz are respectively applied from a high-frequency power source (not shown) to the ion sources 21a and 21b at an output of 1 kW, thereby ionizing the gases. For example, the monosilane gas is ionized into $SiH^+$, $SiH_2^+$, $SiH_3^+$, $SiH_2^+$, $SiH_2^{2+}$, $SiH_3^{2+}$, and the like, and the $O_2$ gas is ionized into $0^+$, $O^{2+}$, $O_2^+$, $O_2^{2+}$, and the like. At this time, a voltage of $-200$ V is applied to ion-drawing electrodes 22a and 22b to draw each type of ions. Thus, each type of ions accelerated at 200 to several hundreds of eV are converged by the convergence lenses 23a and 24a or 23b and 24b to form an ion beam having a diameter of 15 mm. The ion beams are radiated through electric fields of the mass filters 25a and 25b. Since each type of ions has a predetermined ratio of mass to charge, each type of ions is traced along the corresponding track. Therefore, an electric field strength is properly selected to extract arbitrary types of ions and to supply them to decelerators 26a and 26b.

In the second embodiment, electric field strengths in the mass filters 25a and 25b are changed in accordance with a lapse of time. As a result, the selected species are shown in Table 1. The selected species shown Table 1 are repeated for a period exceeding 40 msec.

TABLE 1

| Time (msec) | 0-10 | 10-20 | 20-30 | 30-40 |
|---|---|---|---|---|
| Species 1 | SiH$_3$ | SiH$_2$ | SiH$_3$ | None |
| Species 2 | None | None | O | O |

Both types of ions are decelerated to an acceleration energy of about 1 eV by the decelerators 26a and 26b. These ions are electrically neutralized by neutralizing chambers 27a and 27b and then supplied to a reaction furnace 10. Non-neutralized ions are deflected by an electric field in a deflector 14 in the reaction furnace 10 and are traced along a track which does not reach a substrate 11. Thus, only the species of SiH$_3$ and O reach the substrate 11. At this time, the substrate 11 is heated to a temperature of about 380° C. by a heater 13.

The SiH$_3$ species is chemically reacted with the O species on the surface of the substrate 11 to form an SiO$_2$ film. The obtained SiO$_2$ film is etched by a hydrogen fluoride buffer solution (NH$_4$F of 30%, HF of 6%) at a rate of 850 Å/min. This etching rate is lower than that of the first embodiment. That is, the obtained SiO$_2$ film has acid resistance superior to that of the first embodiment. This is because the species supplied during each period of time are supplied at a timing corresponding an elementary reaction to form a dense film.

According to the first and second embodiments, only SiH$_3$ and O species can be selected from species supplied to the substrate. For this reason, only the SiH$_3$ species is chemically reacted with only the O species to form an SiO$_2$ film. Therefore, the formed thin film does not contain intermediates. As a result, the thin film having excellent film characteristic (in this case, acid resistance) can be obtained. Species to be selected can be freely selected by properly selecting electric fields in the mass filters 25a and 25b. For this reason, thin films having various compositions can be formed.

In these embodiments, two species supplying means are used. At least one pair of species supplying means may be used. A specific gas may be directly supplied to the reacting furnace without being selected. For example, a specific species is selected from an SiH$_4$ gas using one gas supplying means, and an O$_2$ gas is directly supplied to the reaction furnace. An electron beam may be irradiated onto a gas to charge its species with negative charges. In each of the first and second embodiments, the thin film is formed by heating the substrate using the heater. However, in order to decrease a film forming rate, a thin film may be formed by cooling the substrate as needed. In addition, in order to accelerate the chemical reaction on the substrate or to neutralize charged particles, light, an ion beam, a molecular beam, or an electron beam may be irradiated onto a substrate during formation of a thin film. In order to decelerate ions, for example, the substrate is biased by −80 V by the DC power source to decrease an apparent acceleration voltage. In this case, light, an ion beam, a molecular beam, or an electron beam is irradiated onto the substrate to neutralize ions.

FIG. 1B shows another exmaple of the structure of reaction furnace 10. This structure is a remodeled version of that shown in FIG. 1A, modified with prereaction furnace 28a, heater 29 located at the outer side thereof, and reaction furnace 28b provided at the downstream of prereaction furnace 28a. The reaction of species is made to take place in prereaction furnace 28a. Then, the reaction products are transferred on substrate 11 in reaction furnace 28, thereby forming a thin film.

FIG. 2 is a schematic view showing a thin film forming apparatus according to the third embodiment of the present invention.

Referring to FIG. 2, reference numeral 30 denotes a reaction furnace. A sample table 32 on which a substrate 31 is placed is housed in the reaction furnace 30. A heater 33 for heating the substrate 31 is arranged in the sample table 32. An electrode 34 is arranged above the sample table 32. The electrode 34 is connected to a high-frequency power source 35 arranged outside the reaction furnace 30. An exhaust port 36 is formed in the bottom of the reaction furnace 30. An evacuating means (not shown) such as a vacuum pump is connected to the exhaust port 36 to evacuate the reaction furnace 30.

A first quartz tube 41 is connected to a side wall of the reaction furnace 30, and a chiller 42 is connected to the first quarts tube 41. In addition, a second quartz tube 43 is connected to the chiller 42. A gas feed tube 44 is connected to the second quartz tube 43. The internal spaces of the gas feed tube 44, the second quartz tube 43, chiller 42, the first quartz tube 41, and reaction furnace 30 communicate with each other, and a gas fed through the gas feed tube 44 is supplied to the reaction furnace 30 as a species. A waveguide 45 is arranged on the outer surface of the second quartz tube 43, and a high-frequency power source 46 is connected to the waveguide 45. Thus, a microwave power is applied to the quartz tube to generate a microwave discharge in the quartz tube 43. A heater 47 is arranged on the outer surface of the second quartz tube 43 located downstream from the waveguide 45. Holes 48 are formed inside the chiller 42 to cause a coolant to flow through them. A gas passing through the inside of the chiller 42 is cooled by the coolant flowing through the holes 48.

A gas feed tube 51 is connected to the first quartz tube 41. A waveguide 52 is arranged on the outer surface of the gas feed tube 51. A high-frequency power source 53 is connected to the waveguide 52. Thus, a microwave discharge can be generated inside the first quartz tube 41. Reference numeral 54 denotes an insulator; and 55, 56, and 57, sealing gaskets, respectively.

A thin film forming method using this apparatus will be described below.

The Si substrate 31 is placed on the sample table 32. The Si substrate 31 is heated by the heater 33 to a temperature of 200° C. The inside of the reaction furnace 30 is evacuated by a rotary pump to keep the inside of the reaction furnace 30 at a pressure of 0.8 Torr. In addition, the outer surface of the second quartz tube 43 is heated to a temperature of 400° C. by the heater 47. An N$_2$ gas flows in the holes 48 of the chiller 42 to cool the inside of the chiller 42 to a temperature of −60° C.

Tetraethoxysilane (TEOS) and oxygen (O$_2$) gases are fed through the gas feed tube 44 at flow rates of 20 sccm and 200 sccm, respectively. A 2.45-GHz highfrequency wave is applied from the microwave power source 46 to the waveguide 45, thereby exciting species in the TEOS and O$_2$ gases.

In a gas mixture of TEOS and O$_2$, species in the mixture are excited in the first region in the second quartz tube 43 close to the gas feed tube 44 by the waveguide 45. The gas mixture is heated by the heater 47 in the second region located in the downstream from the first region. The gas mixture is cooled by the chiller 42 in the third region between the first and second quartz tubes 41 and the second quartz tubes 43 located in the downstream from the second region. Thereafter, the gas mixture is finally supplied to the reaction furnace 30 and reaches the Si substrate 31. It is guessed that a phenomenon as below occurs. Only the Si, Si(OH)x (X=1-4) species reach the substrate 31. The Si, Si(OH)x species reaching the substrate 31 are chemically reacted with each other on the substrate 31 to form an SiO$_2$ film.

In order to confirm effects of heating by the heater 47 and cooling by the chiller 42, the following items were examined. The results are shown in Table 2. The test items include a film forming rate, an etching tion (NH$_4$F 30% and HF 6%), step coverage on a groove and an infrared absorption spectrum. Heating and cooling conditions are also shown in Table 2. In Table 2, No. represent a sample number; Ts, a substrate temperature (° C.); Th, a heater temperature (° C.); Tc, a chiller temperature (° C.); DR, a film forming rate (Å/min); and ER, an etching rate (Å/min).

TABLE 2

| No. | Ts (°C.) | Th (°C.) | Tc (°C.) | DR (Å/min) | ER (Å/min) |
|---|---|---|---|---|---|
| 1 | 200 | 40 | 25 | 380 | 9452 |
| 2 | 200 | 40 | −60 | 362 | 11108 |
| 3 | 200 | 400 | 25 | 854 | 11472 |
| 4 | 200 | 400 | −60 | 627 | 5336 |

As is apparent from Table 2, when excited species was heated and cooled to form a thin film (sample No. 4), the film forming rate was high and the etching rate was low.

Figures 3A, 3B, 3C, 3D:
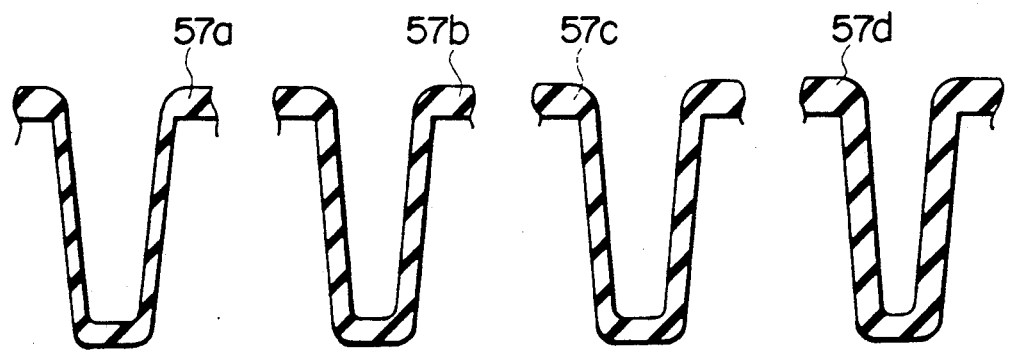
FIGS. 3A, 3B, 3C and 3D are sectional views showing step coverage states.
Figure 4:
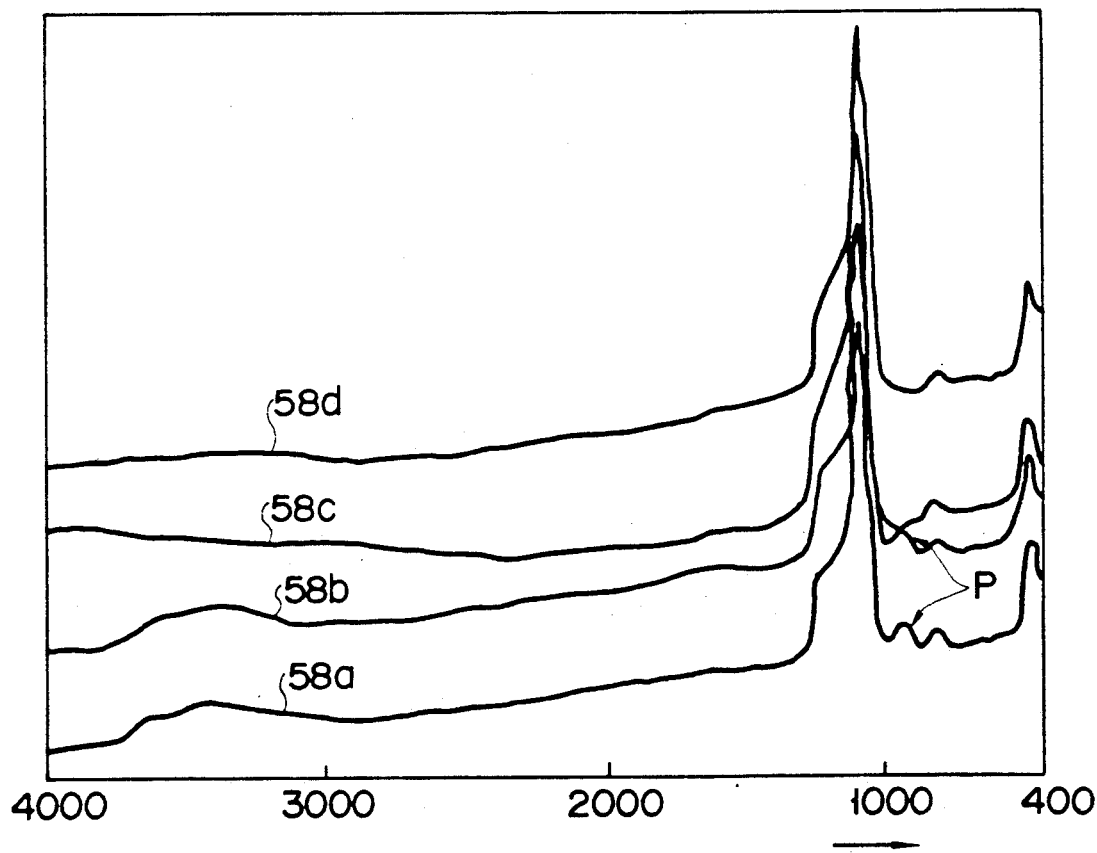
FIG. 4 is a graph showing an infrared absorption spectrum.

Step coverage states are shown in FIGS. 3A to 3D. An SiO$_2$ film 57d of sample No. 4 among SiO$_2$ films 57a to 57d (corresponding to sample Nos. 1 to 4) is formed exactly along the shape of a groove, as shown in FIG. 3D. FIG. 4 is a graph showing characteristic curves of infrared absorption spectra of the SiO$_2$ films of sample Nos. 1 to 4. In the graph in FIG. 4, characteristic curves 58a, 58b, 58c, and 58d respectively are characteristic curves of the infrared absorption spectra of the SiO$_2$ films of sample Nos. 1 to 4. As shown in FIG. 4, the characteristic curves 58c and 58d do not have peaks (indicated by P in FIG. 4) of OH group or hydrocarbon such as CH$_3$ confirmed in the characteristic curves 58a and 58b of sample Nos. 1 and 2. Therefore, it is found that no intermediate is mixed in the films of sample Nos. 3 and 4. As a result, a film having excellent properties can be rapidly formed by using an excited gas species which is heated and cooled.

Note that, although a mechanism for improving the film formed by using heated and cooled gas species is not clear, it is understood that specific species are screened by heating/cooling and a film is formed by only desired species. For example, a species having a low decomposition temperature is decomposed by heating and a decomposition product is attached to the inner wall of the quartz tube. In addition, a species having a low vapor pressure is condensed on the inner wall of the chiller by cooling. Thus, only a desired species can be screened. For this reason, the temperature of the heater 47 is set to decompose species having a decomposition temperature lower than that of the desired species. The temperature of the inside of the chiller 42 is set to condense species having a vapor pressure lower than that of the desired species.

The fourth embodiment of the present invention will be described below. Note that the thin film forming apparatus shown in FIG. 2 is used.

As Si substrate is placed as a substrate 31 on a sample table 32. The Si substrate 31 is heated by a heater 33 to a temperature of 200° C. The inside of a reaction furnace 30 is evacuated by a rotary pump to keep the inside of the reaction furnace 30 at a pressure of 3 Torr. In addition, the outer surface of a second quartz tube 43 is heated to a temperature of 300° C. by a heater 47. An N$_2$ gas flows in the holes 48 of a chiller 42 to cool the inside of the chiller 42 to a temperature of −80° C.

A tetramethylsilane (TMS) gas is fed through a gas feed tube 44 at a flow rate of 50 sccm. A 2.45-GHz high-frequency wave is applied from a microwave power source 46 to a waveguide 45, thereby exciting species in the TMS gas. On the other hand, an oxygen (O$_2$) gas is fed through a gas feed tube 51 at a flow rate of 40 sccm. Thus, the excited species of the TMS gas are heated by the heater 47 and cooled by the chiller 42, and finally reach the Si substrate 31. The O$_2$ gas reaches the Si substrate without being heated/cooled.

A 500-kHz high-frequency wave is applied to an electrode 34 in the reaction furnace 30, and a species of the O$_2$ gas supplied to the reaction furnace 30 is excited to form O$^+$ ions or the like. Therefore, ions such as O$^+$ ions are irradiated onto the Si substrate 31. It is guessed that a phenomenon as below occurs. Only Si atoms reach the substrate 31. The Si atoms reaching the substrate 31 are chemically reacted with each other on the substrate 31 to form an SiO$_2$ film.

The SiO$_2$ film obtained in the fourth embodiment was etched by a hydrogen fluoride buffer solution at a rate of 7,800 Å/min. This etching rate was improved compared with a conventional etching rate of 15,000 Å/min.

The fifth embodiment of the present invention will be described below. Note that the same thin film forming apparatus as the apparatus shown in FIG. 2 except for using a sample table having a coolant path (not shown) is used.

An O$_2$ gas is fed through a gas feed tube 44 at a flow rate of 200 sccm. A TMS gas is fed through a gas feed tube 51 at a flow rate of 29 sccm. A coolant flows through the coolant path of a sample table 32 to cool a substrate 31 to a temperature of −30° C. At this time, a species in the O$_2$ gas is excited by a high-frequency wave applied from a waveguid 45. On the other hand, any species of the TMS gas is not excited A species of the O$_2$ gas, i.e., O atoms, oxidizes the TMS gas in a gaseous phase. Thus, hexamethyldisiloxane [Si(CH$_3$)-]$_2$O and the like are produced. The produced hexamethyldisiloxane and the like reach the cold substrate 31 to be condensed. An SiO$_2$ film is formed on the substrate by this condensation. This is so-called condensation CVD. Note that the condensation rapidly occurs at a portion having a low equilibrium vapor pressure or at a corner portion of a groove having negative curvature. Therefore, the SiO$_2$ film is formed in the groove as if it has flowed in it.

In the fifth embodiment, when a thick SiO$_2$ film is formed on the groove having a large aspect ratio, the film is cracked after the product is exposed in the air. This problem is solved by heating O atoms to a temperature of 500° C. by a heater 47.

Figure 6:
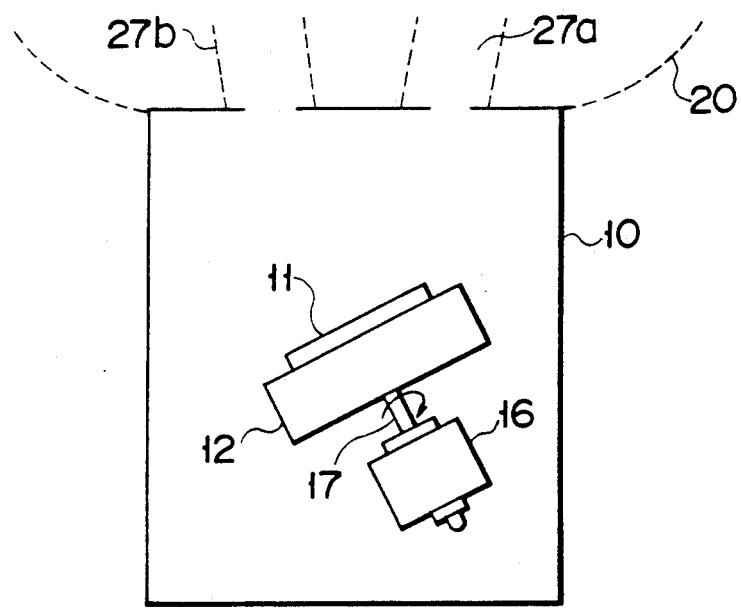
FIG. 6 is a view showing a main part of the thin film forming apparatus according to the seventh embodiment of the present invention.

FIG. 5 is a schematic view showing a film forming apparatus according to the sixth embodiment of the present invention. Referring to FIG. 6, reference numeral 60 denotes a reaction vessel made of quartz. A reaction tube 61 made of carbide is arranged inside the reaction vessel 60. The reaction tube 61 is grounded and is electrically insulated from the electrode 64 by insulator. A quartz boat 62 is placed inside the reaction tube 61. A silicon wafer 63 is loaded on the quartz boat 62. An electrode 64 is arranged outside the reaction vessel 60. A high-frequency power source 65 is connected to the electrode 64. A heater 66 is arranged outside the reaction vessel 60. The reaction vessel 60, the reaction tube 61, the quartz boat 62, and the silicon wafer 63 are heated to a temperature of, e.g., 350° C. by the heater 66. The inside of the reaction tube 61 is evacuated by an evacuating means (not shown) such as a rotary pump to be kept at a pressure of about 0.13 Torr. A cooler 67 is arranged in the upper portion of the reaction tube 61 in the reaction vessel 60. In the above arrangement, the reaction vessel 60 is used as a species supply means, and the reaction tube 61 is used as a reaction furnace.

In a thin film forming apparatus with the above arrangement, a tungsten hexafluoride ($WF_6$) gas is fed to the reaction vessel 60 through a gas feed port in the bottom of the reaction vessel 60 between the reaction vessel 60 and the reaction tube 61. A 13.56-MHz high-frequency wave is applied to the electrode 64 to generate a plasma in the reaction vessel 60. In this case, since the reaction tube 61 is shielded, a plasma atmosphere is formed in the reaction tube 61. The fed $WF_6$ gas is activated in the reaction vessel 60 to form a plurality of species. The species are moved upward to the cooler 67 cooled at a temperature of about $-30°$ C. The species are cooled to extract specific species. The specific species fall and reach the surface of the silicon wafer 63 arranged in the reaction tube 61. A hydrogen ($H_2$) gas is directly fed to the reaction tube 61 through a feed port connected to the reaction tube 61. Thus, a W thin film formation is performed.

A W film is normally formed by thermal CVD. This is because so-called "selective growth" can be performed, i.e., the W film is formed on a silicon and not formed on an $SiO_2$ film. Thus, contact holes of an LSI can be excellently buried. However, when the W film is formed by plasma CVD, although a film forming rate is high, the "selective growth" cannot be performed.

Contrary to this, in the sixth embodiment, a species contributing to the "selective growth" is selected from $WF_6$ species by the cooler 67. Thereafter, the selected species is supplied to the reaction tube 61 and reaches the silicon wafer 63. For this reason, a W film can be selectively formed at high speed The obtained W film has a resistance of 6 $\mu\Omega$cm. This resistance is lower than that (9 to 15 $\mu\Omega$cm) of a W film obtained by a conventional method.

In the third to sixth embodiments, TEOS, TMS, $O_2$, $WF_6$, and $H_2$ gases are used as source gases. Various gases can be used without departing from the scope and spirit of the present invention. For example, a silane ($SiH_4$) gas and a nitrogen oxide ($N_2O$) gas can be used. In addition, an ascillation frequency of each high-frequency power source is not limited, either. In the third to sixth embodiments, heating is performed in the first selection process, and cooling is performed in the second selection process. This order can be reversed. Depending on types of thin films to be formed, the selection process may be performed by only heating or cooling. In order to accelerate formation of a thin film on a substrate, the substrate may be irradiated with light, an ion beam, a molecular beam, an electron beam, or the like.

FIG. 6 is a view for explaining a main part of a thin film apparatus according to the seventh embodiment of the present invention. The same reference numerals in FIG. 7 denote the same parts as in FIG. 1, and its detailed description is omitted.

In the seventh embodiment shown in FIG. 6, a thin film is formed while rotating a sample table 12 on which a substrate 11 is placed. That is, the sample table 12 is connected to a motor 16 through a shaft 17. In this case, this shaft is arranged to be inclined from the vertical direction by a predetermined angle. Thus, the substrate 11 can be rotated about the shaft which is perpendicular to the substrate 11 surface and inclined from the vertical direction by the predetermined angle. Therefore, species can be supplied to the substrate surface from various directions. For this reason, the film characteristic and step coverage of a thin film formed on the substrate 11 can be improved.

Figure 7A:
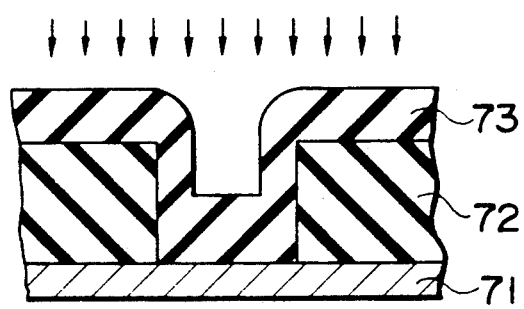
FIGS. 7A and 7B are views for explaining a state wherein ions are irradiated onto a sample.
Figure 7B:
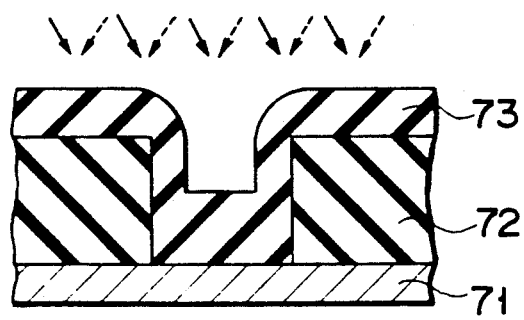

Practically, a thin film formed on a sample whose surface has a U-shaped groove is estimated. As shown in FIG. 7A, when species are radiated vertically onto the sample surface, the species are irradiated onto only the upper surface of the thin film to be formed. In this case, the species are not irradiated onto a side wall portion 70 of the U-shaped groove, the film characteristic of the portion 70 is not improved. Contrary to this, as shown in FIG. 7B, when the species are radiated from various directions, the species are irradiated onto the side wall portion 70 of the U-shaped groove. For this reason, the film characteristic of the portion 70 can be improved equally to other portions. Note that, in FIGS. 7A and 7B, reference numeral 71 denotes a substrate; 72, an primary film; and 73, a thin film to be formed. In addition, arrows of solid lines and arrows of broken lines denote directions of incidence.

As shown in FIG. 8A, in formation of a film on a substrate 81 having a projection 82 with overhangs, when species are vertically radiated to form a thin film 83 as shown in FIG. 8B, the species are not irradiated onto the side wall portions of the projection 82. For this reason, cavities 84 are formed at the side wall portions of the projection 82. Contrary to this, as shown in FIG. 8C, when the species are radiated from various directions, the species can be irradiated onto the side wall portions (overhang portions) of the projection 82 to prevent cavity formation. That is, since the substrate is rotated to be inclined, step coverage can be improved.

According to the seventh embodiment, the same effect as in the first embodiment can be obtained, and step coverage of a thin film can be improved.

According to the present invention, a specific species can be selected from a plurality types of activated species using a difference in track corresponding to a ratio of mass to charge, or decomposition caused by heating or condensation caused by cooling. The selected specific species are selected and supplied to a substrate in a reaction furnace. For this reason, there are no various types of intermediates on the substrate. As a result, mixing of the intermediate into a thin film to be obtained can be prevented. Therefore, the thin film formed on the substrate has excellent characteristics.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A thin film forming method, comprising the steps of:
   activating at least one gas to produce a plurality of species having positive or negative charges;
   causing the plurality of species to pass through an electric or magnetic field to select specific species;
   decelerating the selected species; and
   causing the decelerated species to chemically react with another species to form a thin film on the substrate.

2. A method according to claim 1, wherein:
   selection is performed using a difference in a locus of trajectories along which the species travel corresponding a ratio of mss to charge of the species passing through an electric field.

3. A method according to claim 1, wherein gases are independently activated.

4. A method according to claim 1, wherein the gases are activated by a high-frequency discharge.

5. A method according to claim 1, wherein the selected species are electrically neutralized and then supplied to the substrate surface.

6. A method according to claim 1, wherein:
   the extracted species are neutralized by radiation from at least one member of the group consisting of an electron beam, a molecular beam, an ion beam, and light onto the substrate.

7. A method according to claim 1, wherein the species are successively accelerated, selected, decelerated, and supplied to the substrate surface.

8. A method according to claim 1, wherein:
   species to be selected can be changed by varying the intensity of the electric or magnetic fields in accordance with a lapse of time.

9. A method according to claim 1, wherein the selected species are supplied to the surface of the substrate rotating about an axis inclined from a vertical direction by a predetermined angle.

10. A thin film forming method, comprising the steps of:
    respectively activating first and second gases to produce first and second ion groups;
    respectively accelerating the first and second ion groups;
    causing the accelerated first and second ion groups to pass through an electric or magnetic field to select first and second specific ions from the first and second ion groups, using a difference in a locus of trajectories along which the species travel, corresponding to a ratio of mass to charge of ions;
    decelerating the selected first and second ions; and
    causing the decelerated first and second ions to chemically react with each other to form a thin film on the substrate.

11. A thin film forming method, comprising the steps of:
    activating a gas to produce a plurality of species;
    performing a first selection process of specific species by hating or cooling the plurality of species;
    transporting the species to the vicinity of a substrate; and
    causing the selected species to chemically react with another species to form a thin film on the substrate.

12. A method according to claim 11, wherein:
    a second selection process is performed for the selected species by heating or cooling.

13. A method according to claim 11, wherein the first and second selection processes are different from each other.

* * * * *